United States Patent [19]

Bagdasarian et al.

[11] 4,185,218
[45] Jan. 22, 1980

[54] PIEZOELECTRIC ACOUSTIC SURFACE WAVE FILTER COUPLER

[76] Inventors: Alexandr S. Bagdasarian, ulitsa Popova, 10, kv. 12, Fryazino Moskovskoi oblasti; Jury V. Gulyaev, ulitsa Baikalskaya, 23, kv. 29, Moscow; Anatoly M. Kmita, prospekt Mira, 22, kv. 231, Fryazino Moskovskoi oblasti, all of U.S.S.R.

[21] Appl. No.: 923,548

[22] Filed: Jul. 11, 1978

[30] Foreign Application Priority Data

Jul. 22, 1977 [SU] U.S.S.R. .......................... 2510210[I]

[51] Int. Cl.² .......................................... H01L 41/10
[52] U.S. Cl. .................................................. 310/313
[58] Field of Search ............... 310/313; 333/72, 30 R, 333/193, 196

[56] References Cited

U.S. PATENT DOCUMENTS

| 3,600,710 | 8/1971 | Adler et al. | 333/72 |
| 3,894,251 | 7/1975 | Shibayama | 310/313 |
| 4,006,438 | 2/1977 | Bennett | 333/72 |
| 4,068,141 | 1/1978 | Autran et al. | 310/313 X |

Primary Examiner—Mark O. Budd
Attorney, Agent, or Firm—Holman & Stern

[57] ABSTRACT

An acoustic surface wave filter comprises an input and output acoustic surface wave transducers arranged on a piezoelectric substrate in spaced acoustic channels and a coupling element for the acoustic channels of the input and output transducers, said element being arranged on the same substrate. The coupling element includes three rows of electrodes, two of which are located respectively in the acoustic channels of the input and output transducers while the third one is positioned therebetween. Each row has two groups of electrodes. The electrodes of the rows disposed in the acoustic channels of the input and output transducers are arranged in parallel to the electrodes of its transducer. The electrodes of one of the groups of these rows are interconnected through a current conducting bus. The electrodes of the third row are arranged in parallel to each other so that they have overlapping portions of a variable length defined by a specified impulse response of the filter and are directly connected to the electrodes of the other groups of rows disposed respectively in the acoustic channels. The distance between the longitudinal axes of the adjacent electrodes of the third row differs from the distances between the longitudinal axes of the adjacent electrodes of the other two rows.

2 Claims, 3 Drawing Figures

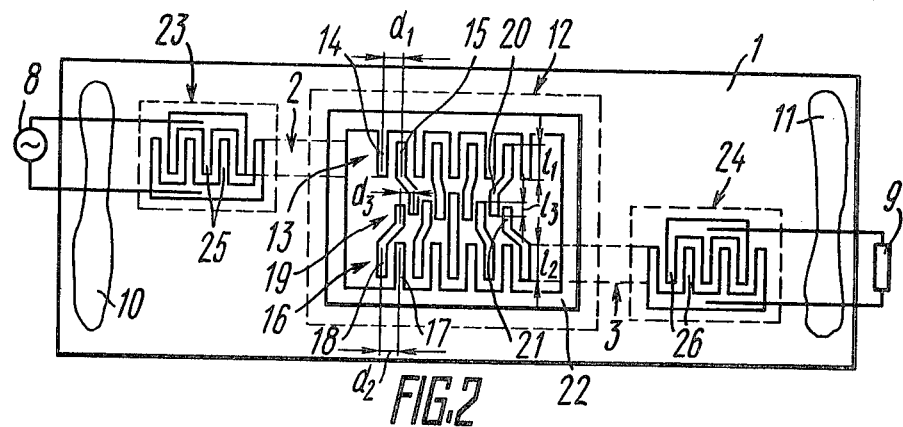
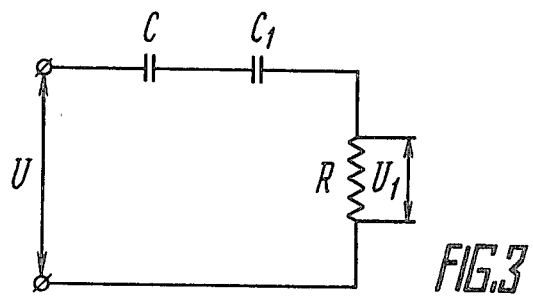

PIEZOELECTRIC ACOUSTIC SURFACE WAVE FILTER COUPLER

FIELD OF THE INVENTION

The present invention relates to filters and, more particularly to acoustic surface wave filters.

The invention can successfully be used in data processing systems for frequency selection of radio signals.

BACKGROUND OF THE INVENTION

Known in the art is an acoustic surface wave filter having a piezoelectric substrate, an input and output acoustic surface wave interdigital transducers arranged in one acoustic channel (cf. R. H. Tancrell and M. G. Holland "Acoustic Surface Wave Filter Proc. IEEE," vol.59, No.3, p.p.393–409. Mar.1971).

In this filter, one of the transducers, e.g. the input transducer is apodized, i.e. the length of the overlapping portions of the adjacent electrodes of this filter is changed in accordance with a specified law of amplitude modulation in the impolse response of the filter. The other (output) transducer is a wide-band and non-apodized device, i.e. having the same length of the overlapping portions of all electrodes. In such a filter, the amplitude-frequency response is provided only by one transducer, namely, by the apodized transducer, namely, by the apodized transducer so that it is impossible to achieve a high level of suppression of the signal beyond the filter pass band. Therefore, the shape of its amplitude-frequency response is unsatisfactory.

Also known in the art is an acoustic surface wave filter comprising an input and output acoustic surface wave transducers arranged on a piezoelectric substrate in spaced acoustic channels and a coupling element connecting the acoustic channels of the input and output transducers, said element being arranged on the same piezoelectric substrate (cf. J. M. Deacop, J. Heighway, I. A. Jenkins "Multistrip Coupler in Acoustic Surface Wave Filters Electr. Let. vol.9, No.10, p.235, 1973)." In this filter, both transducers are apodized while the coupling element is made in the form of a multistrip system of electrodes.

In the above described filter the high-frequency signal fed to the input transducer is converted into acoustic surface waves, which run to the multistrip system of electrodes and are transformed there to an acoustic signal of the output transducer where they are again transformed to a high-frequency signal. During the conversion of the acoustic surface waves the acoustic surface wave front is levelled on the electrode system along the beam aperture. This makes it possible to provide the amplitude-frequency response of the filter by apodizing both input and output transducers. The resultant amplitude-frequency response of such a filter is the product of the amplitude-frequency responses in the input and output transducers. This makes it possible to improve the shape of the resultant amplitude-frequency response of the filter. However, the level of suppression of the signal outside of the pass band of this filter is inadequate. Therefore, the shape of the amplitude-frequency response of this filter, like that of the filter described above, is unsatisfactory. In addition, a very limited amount of materials can be used for making such a filter, since the multistrip system of electrodes coupling the acoustic channels of the transducers can be realized only in materials having a high electromechanical coupling constant (e.g. lithium niobate). In materials having a relatively low electromechanical coupling constant (e.g. in quartz), the number of electrodes in the multistrip system is unacceptably large.

SUMMARY OF THE INVENTION

An object of the present invention is to improve the shape of the amplitude-frequency response of an acoustic surface wave filter.

Another object of the invention is to extend the range of materials for the piezoelectric substrate of the acoustic surface wave filter.

These and other objects are attained by that in an acoustic surface wave filter comprising an input and output acoustic surface wave transducers arranged on a piezoelectric substrate in spaced acoustic channels and an element coupling the acoustic channels of the input and output transducers located on the same piezoelectric substrate, according to the invention, the element for coupling the acoustic channels of the input and output transducers includes a first row of electrodes arranged in the acoustic channel of the input transducer and consisting of a first and second groups of electrodes in parallel to the electrodes of the input transducers and arranged so that the electrodes of the second group are disposed between the electrodes of the first group and form overlapping portions therewith, a second row of electrodes located in the acoustic channel of the output transducer and consisting of a third and forth groups of electrodes in parallel to the electrodes of the output transducer and arranged so that the electrodes of the fourth group are disposed between the electrodes of the third group and form overlapping sections therewith, and a third row of electrodes located between the first and second rows and consisting of a fifth and sixth groups of electrodes arranged in parallel to each other and in such a way that the electrodes of the sixth group are disposed between the electrodes of the fifth group and form therewith overlapping portions of a variable length determind by a specified impulse response of the filter, in which case the distance between the longitudinal axes of the adjacent electrodes of the third row is selected so that it differs from the distance between the longitudinal axes of the adjacent electrodes of the first and second rows while the electrodes of the first and third group are interconnected through a current conducting bus and the electrodes of the second and fourth groups are coupled directly to the electrodes of the fifth and sixth groups respectively.

It is expedient that the electrodes of the first and second rows have overlapping portions of the same length respectively.

Such an embodiment of an acoustic surface wave filter provides a high level of suppression of signals outside of the filter pass band and a steep decay of the amplitude-frequency response of the filter, which allows materials having both high and low electromechanical coupling constants to be used for making this filter.

BRIEF DESCRIPTION OF THE INVENTION

These and other objects will become more apparent upon consideration of specific embodiments of the invention with reference to the accompanying drawings, in which:

FIG. 2 is a top view of another embodiment of the filter according to the invention;

FIG. 3 is an equivalent circuit diagram for a pair of electrodes of the second row of electrodes of the filter shown in FIGS. 1 and 2.

DETAILED DESCRIPTION OF THE INVENTION

Figure 1:
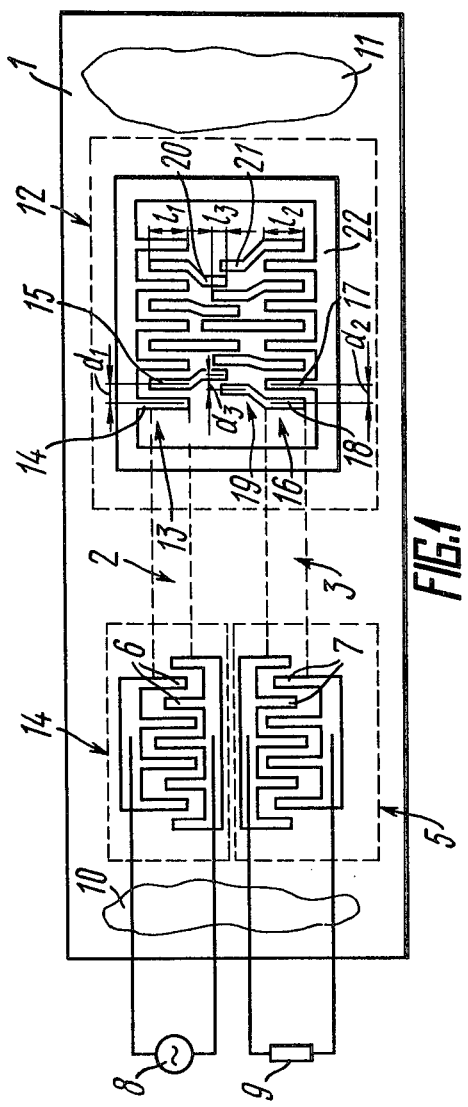
FIG. 1 is a top view of a filter according to the invention.

The acoustic surface wave filter according to the present invention comprises a piezoelectric substrate 1 (FIG. 1) made in the form of a plate of a material having a low electromechanical coupling constant, such as quartz, bismuth silicate or germanate. The substrate 1 may be made of a material having a high electromechanical coupling constant, e.g. lithium niobate.

Arranged on the substrate 1 in spaced parallel acoustic channels 2 and 3 are input 4 and output 5 acoustic surface wave interdigital transducers having a variable length of the overlapping portions of electrodes 6 and 7, respectively (apodized electrodes). The law of change of the length of these portions is defined by a specified impulse response of the filter. The input transducer 4 is connected to a source 8 of a high-frequency signal while the output transducer 5 is connected to a load 9. Acoustic surface wave absorbers 10 and 11 are arranged at the ends of the substrate 1.

Located on the substrate 1 at one side of the transducers 4 and 5 is an element 12 for coupling the acoustic channels 2 and 3 of the input 4 and output 5 acoustic surface wave transducers. The coupling element 12 includes a first row 13 of electrodes 14, 15, a second row 16 of electrodes 17, 18 and a third row 19 of electrodes 20, 21. The first row 13 of electrodes 14, 15 is arranged in the acoustic channel 2 of the input transducer 4 and comprises a first group of electrodes 14 and a second group of electrodes 15. The electrodes 14 and 15 are positioned in parallel to the electrodes 6 of the input transducer 4 and are arranged so that the electrodes 15 are located between the electrodes 14 and form therewith overlapping portions of the same length $l_1$. The second row 16 of electrodes 17, 18 is located in the acoustic channel 3 of the output transducer 5 and comprises a third group of electrodes 17 and a fourth group of electrodes 18. The electrodes 17 and 18 are positioned in parallel to the electrodes 7 of the output transducer 5 and arranged so that the electrodes 18 are disposed between the electrodes 17 and form therewith overlapping portions of the same length $l_2$. A third row 19 of electrodes 20, 21 is arranged between the first 13 and second 16 rows and comprises a fifth group of electrodes 20 and a sixth group of electrodes 21. The electrodes 20 and 21 are parallel to each other and are arranged so that the electrodes 21 are located between the electrodes 20 and form therewith overlapping portions of a variable length $l_2$, which is defined by a specified impulse response of the filter.

In the embodiment of the filter being described the electrodes 14 and 17 are interconnected through a current conducting bus 22 while the electrodes 15 and 18 are coupled directly to the electrodes 20 and 21, respectively. The current conducting bus is made in the form of a closed loop encompassing the first 13, second 16 and third 19 rows of electrodes and is grounded. As mentioned above, the electrodes 15 and 18 are directly coupled to the electrodes 20 and 21 respectively. Thus, the electrodes 15 and 18 are interconnected through a capacitance formed by the corresponding adjacent electrodes 20 and 21. The distances $d_1$ and $d_2$ between the longitudinal axes of the adjacent electrodes 14, 15 and 17, 18 (space period) are equal to the space period of the electrodes 6 of the input transcuder 4 and of the electrodes 7 of the output transducer 5 and are selected on the basis of the acoustic synchronism conditions, i.e.

$$d_1 = d_2 = (V/f_o), \quad (1)$$

where

V = propagation velocity of the acoustic surface wave, $f_o$ = centre frequency of the filter.

The space periods $d_1$ and $d_2$ of the first 13 and second 16 rows of electrodes 14, 15, and 17, 18 can also be selected taking into account the condition of acoustic synchronism on the odd characteristics, i.e.

$$d_1 = (V/f_o)(2m+1) \quad (2)$$

and $$d_2 = (V/f_o)(2n+1) \quad (3),$$

where m, n = 0, 1, 2 . . .

In some cases, for example when forming a nonsymmetric amplitude-frequency response, the space period of the input 4 and output 5 transducers differs from that of the first 13 and second 16 rows of electrodes 14, 15 and 17, 18 and is calculated stemming from a frequency to some extent differing from the centre frequency of the filter.

The distance $d_3$ between the longitudinal axes of the adjacent electrodes 20 and 21 (space period) differs from the space period of the electrodes 14, 15 and 17, 18 of the first 13 and second 16 rows and is selected from the condition that the intrinsic pass band of the electrodes 20, 21 of the third row 19 is outside of the pass band of the filter. In particular, it is necessary that the space period of the electrodes 20, 21 of the third row 19 satisfies one of the following two inequalities $$d_3 < (V/f_o)(1 + 1/N) \quad (4)$$

or $$d_3 > (V/f_o)(1 - 1/N) \quad (5)$$

where N is the number of pairs of electrodes in each row. (Two adjacent electrodes of different groups in a row form a pair). In the filter being described the number of pairs of electrodes in all three rows is the same).

In another embodiment of the filter, the input 23 (FIG. 2) and output 24 acoustic surface wave interdigital transducers are non-apodized, i.e. they have identically overlapping portions of the electrodes 25 and 26 and are located at both sides of the element 12 for coupling the acoustic channels 2 and 3.

In this embodiment of the invention, the length $l_1$ of the overlapping portions of the electrodes 14 and 15 of the first row 13 is equal to the length of the overlapping portions of the electrodes 25 of the input transducer 23, while the length $l_2$ of the overlapping portions of the electrodes 17 and 18 of the second row 16 is equal to the length of the overlapping portions of the electrodes 26 of the output transducer 24.

Regardless of the design of the input and output transducers, a coating absorbing acoustic surface waves may be provided on the third row of electrodes. When this coating is made of a material having a high dielectric constant, the required dimensions of the filter are reduced, since in this case there is reduced the maximum length of the overlapping portions of the electrodes in the third row due to an increase in the running capacitance per unit length of the overlapping electrodes.

The principle of operation of the filter according to the invention is as follows.

A high-frequency signal from the generator 8 (FIGS. 1 and 2) is fed to the input transducer 4 (23) and is converted into acoustic surface waves which propagate through the acoustic channel towards the first row 13 of electrodes 14,15. Having reached the first row 13, the acoustic surface waves produce a high-frequency signal on each pair of adjacent electrodes 14 and 15 of the first and second groups. Each such a pair of electrodes 14 and 15 may be considered as a source of high-frequency signals loaded by the corresponding adjacent pair of electrodes 17 and 18 of the second row 16 formed by the electrodes 17 and 18 of the third and fourth groups, since the electrodes 14 of the first group of the first row 13 are galvanically coupled to the electrodes 17 of the third group of the second row 16, while the electrodes 15 of the second group of the first row 13 are connected to the electrodes 18 of the fourth group of the second row through a capacitance formed by the corresponding adjacent overlapping electrodes 20 and 21 of the fifth and sixth groups of the third row 19. The high-frequency signal fed to the electrodes 17 and 18 of the third and fourth groups of the second row 16 is again converted into acoustic surface waves which propagate towards the output transducer 5 (24) but through another acoustic channel 3. Having reached the transducers 5 (24), the acoustic surface waves transform into a high-frequency signal, which is extracted on the load 9.

In the filter according to the invention the voltage of the high-frequency signal taken from each pair of adjacent electrodes 14, 15 of the first row 13 is defined by the capacitance of the capacitor between the corresponding electrodes 20, 21 of the third row 19 which, in turn, is defined by the length $l_3$ of the overlapping portions of these electrodes. Thus, by changing the length $l_3$ of the overlapping portions of the electrodes 20, 21 in the third row 19, one can weight the voltage taken from each pair of adjacent electrodes 14, 15 in the first row 13, i.e. to shape a required impulse response of the filter. Since the amplitude-frequency response of the filter provided in one acoustic channel 2 is a Fourier transform of its impulse response, by specifying a definite law of change of the length $l_3$ of the overlapping portions of the electrodes 20, 21 in the third row 19, one can obtain a required amplitude-frequency response in the acoustic channel 2 of the input transducer 4 (23). In a similar way, having the electrodes 17, 18 of the second row 16 acted on by the weighted voltage from the corresponding electrodes 14, 15 of the first row 13, the shape of the amplitude-frequency response formed in the acoustic channel 3 of the output transducer 5 (24) is also defined by the law of change of the length $l_3$ of the overlapping portions of the electrodes 20, 21 in the third row 19. The resultant amplitude-frequency response of the filter is the product of the amplitude-frequency responses in the acoustic channels 2 and 3 of the input 4 (23) and output 5 (24) transducers. Since the shape of the amplitude-frequency response formed both in the acoustic channel 2 of the input transducer 4 (23) and in the acoustic channel 3 of the output transducer 5 (24) is defined by the same law of change of the length of the overlapping portions of the electrodes 20, 21 in the third row 19, the resultant amplitude-frequency response of the filter is a square of the amplitude-frequency response formed in the acoustic channel of the input transducer 4 (23) or the output transducer 5 (24).

An equivalent circuit for a pair of electrodes 17,18 e.g. of the second row 16, is shown in FIG. 3. Here U is the high-frequency voltage applied to the pair of electrodes 17, 18 of the second row 16 from the corresponding pair of electrodes 14, 15 of the first row 13; C is the static capacitance of the pair of electrodes 17, 18 of the second row 16; $C_1$ is the capacitance of the corresponding pair of electrodes 20, 21 of the third row 19; R is the radiation resistance of the pair of electrodes 17,18 of the second row 16. The amplitude of the acoustic surface waves radiated by the second row 16 of electrodes in the direction of the output transducer 5 (24) is proportional to the voltage $U_1$, which is determined by the relation $$U_1 = U \frac{R}{\left[ R^2 + \frac{1}{(2\pi f_0)^2} \left( \frac{1}{C_1} + \frac{1}{C} \right)^2 \right]^{\frac{1}{2}}} \qquad (6)$$

The calculations of the filter are preferably based on its specified amplitude-frequency response. In this case, first, we calculate the amplitude-frequency response to be formed in one acoustic channel 2 (FIGS. 1 and 2), i.e. such a frequency response whose ordinates are proportional to the square root of the ordinates of the specified frequency response of the filter. Then calculation is made of the impulse response of the filter to be formed in this acoustic channel. Having a ratio $U_1/U$, we calculate the magnitude of the capacitance $C_1$ using the formula given above. After that we find the length $l_3$ of the overlapping portions of the corresponding electrodes 20, 21 in the third row 19 at which the calculated capacitance can be realized.

Since the intrinsic pass band of the electrodes 20, 21 of the third row 19 is outside of the pass band of the filter, the presence of this row does not introduce additional losses and distort the amplitude-frequency response of the filter. What is more, the intrinsic pass band of the electrodes 20, 21 of the third row 19 can be superposed with one of the bursts on the amplitude-frequency response of the filter outside of its pass band, e.g. with the frequency band of effective excitation of the parasitic shifts of the volume waves. In this case at these frequencies the third row 19 introduces frequency-selective dissipative energy loses increasing the signal suppression outside of the pass band of the filter. Thus the shape of the amplitude-frequency response of the filter is improved.

The above described design of the coupling element 12 (FIG. 2) in the proposed filter makes it possible to use the input 23 and output 24 interdigital transducers with a constant length of the overlapping portions of the electrodes 25, 26, because the amplitude-frequency response of the filter is shaped in the first 13 and second 16 rows of electrodes of the coupling element 12. As a result, in such a design of the filter it is possible to completely eliminate the diffraction effects thus considerably improving the amplitude-frequency response of the filter.

When the proposed filter is provided with apodized transducers 2 and 3 (FIG. 1) in combination with the above described design of the coupling element 12, the resultant amplitude-frequency response of the filter is a product of the amplitude-frequency response formed in both transducers 2 and 3 and also in the first 13 and second 16 rows of electrodes. Due to this fact additional suppression of the signals outside of the pass band of the filter is achieved and the shape of the amplitude-frequency response of this filter is improved. Furthermore, the version of the filter with apodized input 2 and output 3 transducers makes it possible to attain a complex amplitude-frequency response, e.g. a non-symmetric characteristic.

Along with the above-mentioned advantages, the proposed filter does not present any problems associated with the necessity of making a large number of electrodes for transferring the acoustic surface waves from the acoustic channel 2 (FIGS. 1, 2) of the input transducer 4 (23) into the acoustic channel 3 of the output transducer 5 (24). Therefore, the proposed filter can be made using a wide variety of materials including those having a low electromechanical coupling constant, and the use of these materials is most expedient in narrow-band filters.

The proposed filter is simple in design and manufacture. It can be based on standard technology of making integrated circuits.

When inexpensive and available materials, such as quartz, bismuth silicate or germanate, are used as a substrate, the manufacturing cost of the filter is considerably reduced. A combination of the above listed features and advantages of the filter provide its good operational parameters and comparatively low manufacturing cost in the case of mass production.

In the description of the embodiments of the invention specific terminology is used for clarity. However, the invention is not restricted to the accepted terms and it should be understood that each such term covers all equivalent elements operating in a similar way and used for solving the same problems.

Although the present invention is described in a preferred embodiment thereof, it is clear for those skilled in the art other embodiments can be realized without departing from the scope and idea of the present invention.

These embodiments are within the scope of the present invention as stated in the following claims.

What is claimed is:

1. An acoustic surface wave filter comprising:
a piezoelectric substrate;
an input acoustic surface wave interdigital transducer arranged on said substrate and having electrodes exciting acoustic surface waves propagating through the individual acoustic channel of this transducer;
an output acoustic surface wave interdigital transducer arranged on said piezoelectric substrate and having electrodes receiving said acoustic surface waves through the individual acoustic channel of this transducer and converting them into a radio-frequency signal;
a coupling element for said acoustic channels of said input and output transducers located on said substrate, receiving said acoustic surface waves propagating through said acoustic channel of said input transducer and transferring them to said acoustic channel of said output transducer; said coupling element including a first row of electrodes having longitudinal axes located in said acoustic channel of said input transducer and having a first group of said electrodes in parallel to said electrodes of said input transducer, a second group of said electrodes in parallel to said electrodes of said input transducer; said electrodes of the first and second groups being arranged so that said electrodes of the second group are disposed between said electrodes of the first group and from overlapping portions therewith; a second row of electrodes having longitudinal axes located in said acoustic channel of said output transducer and having a third group of said electrodes in parallel to said electrodes of said output transducer and directly connected to said electrodes of the first group through a current conducting bus; a fourth group of said electrodes in parallel to said electrodes of said output transducer, said electrodes of the third and fourth groups being arranged so that said electrodes of the fourth group are disposed between said electrodes of the third group and form overlapping portions therebetween; a third row of electrodes having longitudinal axes located between the first and second rows and having a fifth group of said electrodes directly connected to said electrodes of the second group; a sixth group of said electrodes in parallel to said electrodes of the fifth group and directly connected to said electrodes of the fourth group; said electrodes of the fifth and sixth groups being arranged so that said electrodes of the sixth group are disposed between said electrodes of the fifth group and form therewith overlapping portions of a variable length defined by a specified impulse response of the filter; the distances between said longitudinal axes of the adjacent electrodes of this row differing from the distance between said longitudinal axes of the adjacent electrodes of the fifth and second rows.

2. A filter as claimed in claim 1, in which said electrodes of the first and second rows have respectively said overlapping portions of the same length.

* * * * *